United States Patent
Yin et al.

(10) Patent No.: US 9,012,267 B2
(45) Date of Patent: Apr. 21, 2015

(54) METHOD OF MANUFACTURING A PACKAGED CIRCUIT INCLUDING A LEAD FRAME AND A LAMINATE SUBSTRATE

(71) Applicant: Intersil Americas LLC, Milpitas, CA (US)

(72) Inventors: Jian Yin, San Jose, CA (US); Nikhil Vishwanath Kelkar, Saratoga, CA (US); Loyde Milton Carpenter, Jr., Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 1 day.

(21) Appl. No.: 13/860,974

(22) Filed: Apr. 11, 2013

(65) Prior Publication Data

US 2013/0313694 A1 Nov. 28, 2013

Related U.S. Application Data

(60) Provisional application No. 61/650,763, filed on May 23, 2012.

(51) Int. Cl.
| | |
|---|---|
| *H01L 21/44* | (2006.01) |
| *H01L 21/48* | (2006.01) |
| *H01L 21/50* | (2006.01) |
| *H01L 23/495* | (2006.01) |
| *H01L 23/00* | (2006.01) |

(52) U.S. Cl.
CPC .... *H01L 23/49527* (2013.01); *H01L 23/49531* (2013.01); *H01L 23/49575* (2013.01); *H01L 21/4832* (2013.01); *H01L 24/32* (2013.01); *H01L 2924/1306* (2013.01); *H01L 2924/12032* (2013.01)

(58) Field of Classification Search
USPC .......... 438/123, 107, 109, 110, 112, 124, 127
See application file for complete search history.

(56) References Cited

U.S. PATENT DOCUMENTS

| | | | |
|---|---|---|---|
| 7,394,150 B2 | 7/2008 | Kasem et al. | |
| 8,035,206 B2 | 10/2011 | Cruz | |
| 8,035,221 B2 | 10/2011 | Cruz | |
| 2012/0032317 A1 | 2/2012 | Cruz | |
| 2013/0049179 A1* | 2/2013 | Desai et al. | 257/666 |

OTHER PUBLICATIONS

Yin et al., "A Novel DC-DC Power Module Structure Using Hi-Density Array (HDA)", "IEC 2012", Jan. 2012, pp. 1-6, Publisher: Intersil.

* cited by examiner

*Primary Examiner* — A. Sefer
*Assistant Examiner* — Dilinh Nguyen
(74) *Attorney, Agent, or Firm* — Fogg & Powers LLC (57) ABSTRACT

Embodiments of the subject application provide for a circuit comprising: a lead frame having a first plurality of exposed terminals, the lead frame defining a plane; a laminate substrate in the plane defined by the lead frame, adjacent to the lead frame, and electrically coupled to the lead frame, the laminate substrate having a first surface including a second plurality of exposed terminals and a second surface opposite the first surface; a first one or more dies mounted on the lead frame and electrically coupled to the lead frame; and a second one or more dies mounted on the second surface of the laminate substrate and electrically coupled to the laminate substrate.

4 Claims, 10 Drawing Sheets

METHOD OF MANUFACTURING A PACKAGED CIRCUIT INCLUDING A LEAD FRAME AND A LAMINATE SUBSTRATE

CROSS-REFERENCE TO RELATED APPLICATIONS

This application claims the benefit of priority to U.S. Provisional Application No. 61/650,763, filed on May 23, 2012, which is incorporated herein by reference.

DETAILED DESCRIPTION

Figure 1:
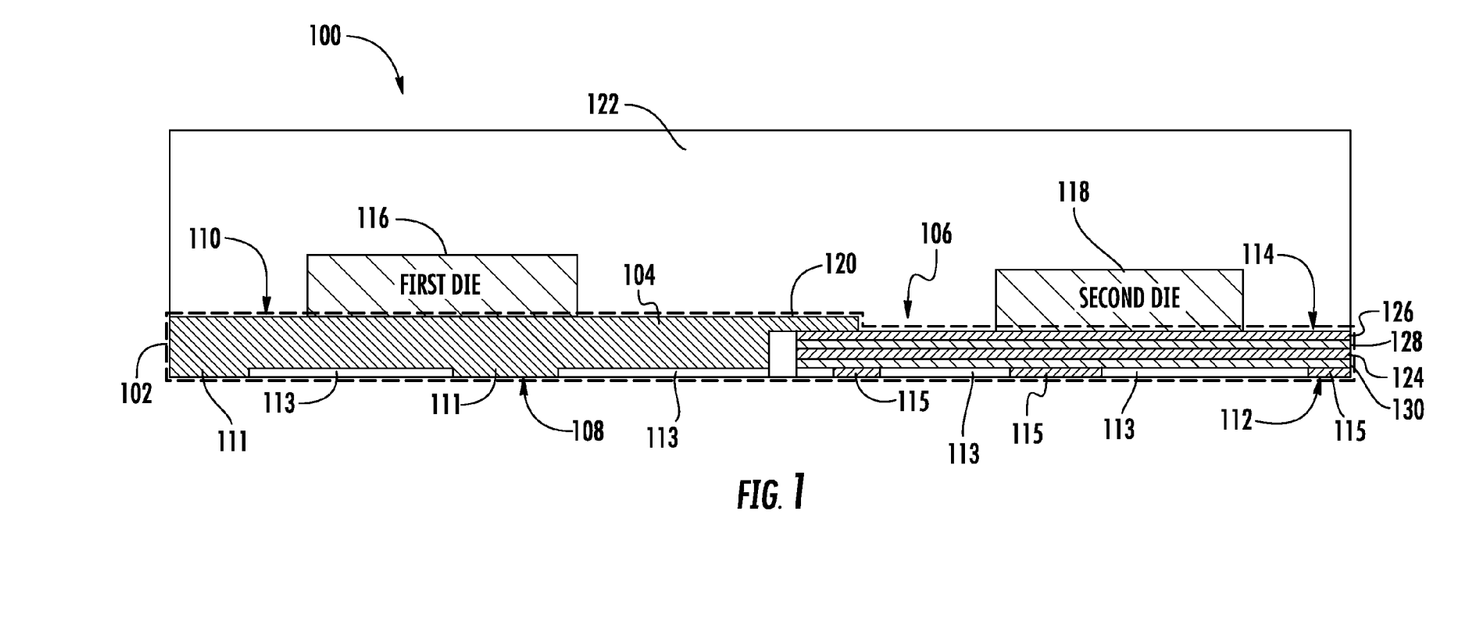
FIG. 1 is a cross-sectional view of an embodiment of a packaged circuit having a combination lead frame and laminate substrate chip carrier.

FIG. 1 is a cross-sectional view of an embodiment of a packaged circuit 100 having a combination lead frame and laminate substrate chip carrier 102. The chip carrier 102 is composed of a lead frame 104 adjacent to a laminate substrate 106. The lead frame 104 comprises one or more sections of a conductive material. Many, or all, of the sections of conductive material can be generally planar and are arranged such that the planar sections collectively define a plane that forms a "bottom" of the packaged circuit 100. The lead frame 104 has an external surface 108 and an internal surface 110. The external surface 108 includes a plurality of external terminals 111 for coupling the lead frame 104 to external circuits. A non-conductive material (e.g., resist) 113 is disposed in recesses between the external terminals 111. The internal surface 110 includes one or more pads for mounting of one or more dies 116.

The laminate substrate 106 is disposed within the plane collectively defined by the sections of the lead frame 104 and adjacent to one or more of the sections of the lead frame 104. The laminate substrate 106 also has an external surface 112 and an internal surface 114. Similar to the lead frame 104, the external surface 112 of the laminate substrate 106 includes a plurality of external terminals 115 for coupling the laminate substrate 106 to external circuits. The external terminals 115 are composed of an electrically conductive material. A non-conductive material (e.g., resist) 113 is disposed between the external terminals 115. The internal surface 110 includes one or more pads for mounting of one or more dies 118. In the example shown in FIG. 1, the external terminals 111 on the external surface 108 of the lead frame 104 and the external terminals 115 on the external surface 112 of the laminate substrate 106 are pads. In other examples, the external terminals 111 can extend from the external surface 108 of the lead frame 104 and the external terminals 115 can extend from the external surface 112 of the laminate substrate 106 as leads. With the laminate substrate 106 in the same plane as the lead frame 104, the external surface 112 of the laminate substrate 106 and the external surface 108 of the lead frame 104 collectively form the external surface of the "bottom" of the packaged circuit 100, such that the external terminals 111 of the lead frame 104 and the external terminals 115 of the laminate substrate 106 are aligned in the plane.

The lead frame 104 is composed of an electrically conductive material such as a metal. In an example, the lead frame 104 is composed of copper. The lead frame 104 can be composed of a plurality of sections of conductive material having any suitable arrangement. In one example, each of the plurality of sections of conductive material abuts an edge of the lead frame 104. In another example, one or more of the sections of conductive material can be floating, that is, the one or more sections of conductive material do not abut an edge portion of the lead frame 104.

The laminate substrate 106 is composed of at least two layers of electrically conductive material with a layer of dielectric material between the at least two layers of electrically conductive material. The laminate substrate 106 can include traces in the conductive layers and through the dielectric material to achieve the appropriate routing interconnection. The example laminate substrate 106 shown in FIG. 1 includes a bottom and top layers 124, 126 of conductive material with a layer 128 of dielectric material between the bottom layer 124 and the top layer 126 and a layer 130 of dielectic material below the bottom layer 124 of conductive material. The terminals 115 and the resist 113 of the laminate substrate 106 can be disposed on the layer 130 of dielectric material. In other examples, the laminate substrate 106 can include more than two layers of conductive material with dielectric material between adjacent layers of conductive material. In an example, the conductive material is a metal (e.g., copper) and the dielectric material is a composite fiber material (e.g., pre-preg).

As shown in FIG. 1, a first one or more dies 116 (also referred to herein as simply "first die 116") are mounted and electrically coupled to the internal surface 110 of the lead frame 104. A second one or more dies 118 (also referred to herein as simply "second die 118") are mounted and electrically coupled to the internal surface 114 of the laminate substrate 106. The lead frame 104 provides electrical coupling between the first die 116 and external terminals 111 on the external surface 108 thereof. The lead frame 104 can also provide electrical coupling between different dies 116 on the internal surface 110. Similarly, the laminate substrate 106 provides electrical coupling between the second die 118 and external terminals 115 on the external surface 112 thereof and can provide electrical coupling between the different dies 118 on the internal surface 114. Since the laminate substrate 106 is composed of multiple layers of conductive material with a dielectric material therebetween, the laminate substrate 106 can provide increased routing capability as compared to the lead frame 104. Accordingly, dies having more extensive routing requirements within the system 100 can be mounted to the laminate substrate 106. The lead frame 104, however, can provide increased heat dissipation capabilities as compared to the laminate substrate 106. Accordingly, dies having more extensive heat dissipation requirements can be mounted to the lead frame 104. Thus, as a combination of a lead frame 104 and a laminate substrate 106, the chip carrier 102 can provide good heat dissipation and good routing capabilities with high density.

In an example, the packaged circuit 100 comprises a power conversion system. The power conversion system can include a power stage as well as a controller and/or driver for the power stage. In an example, dies including power stage components (e.g., transistors) that generate substantial amounts of heat can be mounted to the lead frame 104 and dies including controller and/or driver components can be mounted to the laminate substrate 106. For example, the first die 116 can include one or more of a high side FET, low side FET, or a diode (e.g., Schottky diode). Other components such as a power inductor can also be included on the lead frame 104 and/or laminate substrate 106. Accordingly, the power stage components can achieve good heat dissipation and the controller and/or driver components can achieve good routing of connections in the same packaged circuit. In an example, the power conversion system can comprise a DC-to-DC power converter, a charger, a hot-swap controller, an AC-DC converter, a bridge driver, a buck converter, a boost converter, a buck-boost converter, a synchronous buck converter, or a portion of any of these circuits.

The lead frame 104 and the laminate substrate 106 are electrically coupled together. The electrical coupling can enable the first die 116 on the lead frame 104 to be electrically coupled to the second die 118 on the laminate substrate 106 through the lead frame 104 and laminate substrate 106. In an example, the lead frame 104 and the laminate substrate 106 are electrically coupled together with one or more side terminals 120 of the lead frame 104. The one or more side terminals 120 comprise slender portions of the lead frame 104 that extend from the lead frame 104 toward the laminate substrate 106. As a slender portion, the side terminals 120 are thinner than a main body of the lead frame 104, which enables the side terminals 120 to extend over the internal surface 114 or external surface 112 of the laminate substrate 106. In the example shown in FIG. 1, the side terminals 120 extend over the internal surface 114 of the laminate substrate 106. At or near an end of the side terminals 120, the side terminals 120 are attached to one or more pads on the internal surface 114 of the laminate substrate 106.

Figure 2:
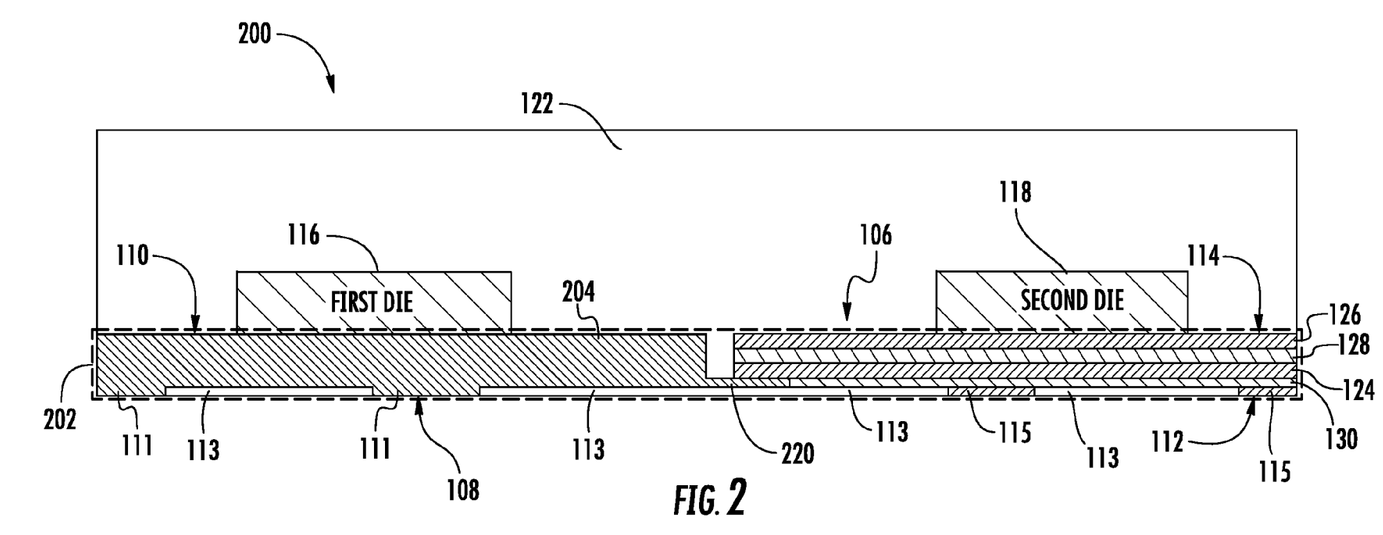
FIG. 2 is a cross-sectional view of another embodiment of a packaged circuit having a combination lead frame and laminate substrate chip carrier.

FIG. 2 is a cross-sectional view of another embodiment of a packaged circuit 200 having a combination lead frame and laminate substrate chip carrier 202. The packaged circuit 200 of FIG. 2 has generally similar components to those of the packaged circuit 100 except the lead frame 204 of the packaged circuit 200 has an side terminal 220 that extends over the external surface 112 of the laminate substrate 106. In an example, the side terminal 220 can extend partially over the external surface 112, overlapping an amount sufficient to enable electrical coupling between the terminal 220 and the external surface 112. The laminate substrate 106 can include a recess defined in the external surface 112, such that the side terminal 220 is disposed within the recess when coupled to the external surface 112. In some examples, the side terminal 220 can include an external terminal(s) 111 on an external surface 108 thereof.

As shown in FIGS. 1 and 2, the side terminals 120, 220 can extend from a side of the lead frame 104, 204 that is adjacent to the laminate substrate 106 and is facing the laminate substrate 106. Although the upper and lower side terminals 120, 220 are shown in separate Figures herein, it should be understood that a single packaged circuit can include one or more upper side terminals 120, one or more lower side terminals 220, or both upper and lower side terminals 120, 220.

In some examples, the lead frame 104 and laminate substrate 106 can be coupled together by one or more wire bonds, copper clips, or other interconnect mechanism instead of or in addition to the side terminals 120, 220. The wire bond(s), copper clip(s), or interconnect mechanism can be attached to the internal surface 110 of the lead frame 104 and the internal surface 114 of the laminate substrate 106. Molding compound 122 can surround the first die 116 and the second die 118 over the lead frame 104 and the laminate substrate 106. The molding compound 122 can comprise any suitable molding compound such as a ceramic, plastic, epoxy, or a combination thereof.

Manufacturing the circuit 100 or 200 into a package can include manufacturing a plurality of the packaged circuits 100, 200 at the same time. Accordingly, a plurality of chip carriers 102, 202, can be assembled adjacent to one another, each having appropriate dies 116, 118 mounted thereon. Once assembled, the carriers 102, 202 and associated components can be singulated to form the individual packaged systems. The following description refers to the process of forming a single packaged circuit 100, 200, but it should be understood that the process can involve forming a plurality of packaged circuits 100, 200 at the same time.

FIGS. 3A-3D are cross-sectional views of example stages in a method of manufacturing a packaged circuit 100, 200 having a combination lead frame and laminate substrate chip carrier 102. The lead frame 104, 204, laminate substrate 106, first die 116, and second die 118 are all obtained. The first die(s) 116 and second die(s) 118 can each be fabricated as a die (e.g., a monolithic substrate) using appropriate semiconductor processes. The laminate substrate 106 can be manufactured having appropriate terminals (115) on the internal and external surfaces 114, 112 and appropriate routing through the layers 124, 126, 128. The lead frame 104, 204 can be manufactured in appropriate sections of conductive material. In embodiments where the lead frame 104, 204 includes side terminals 120, 220 to couple to the laminate substrate 106, the lead frame 104, 204 can be manufactured with the appropriate side terminals 120, 220.

Figure 3A:
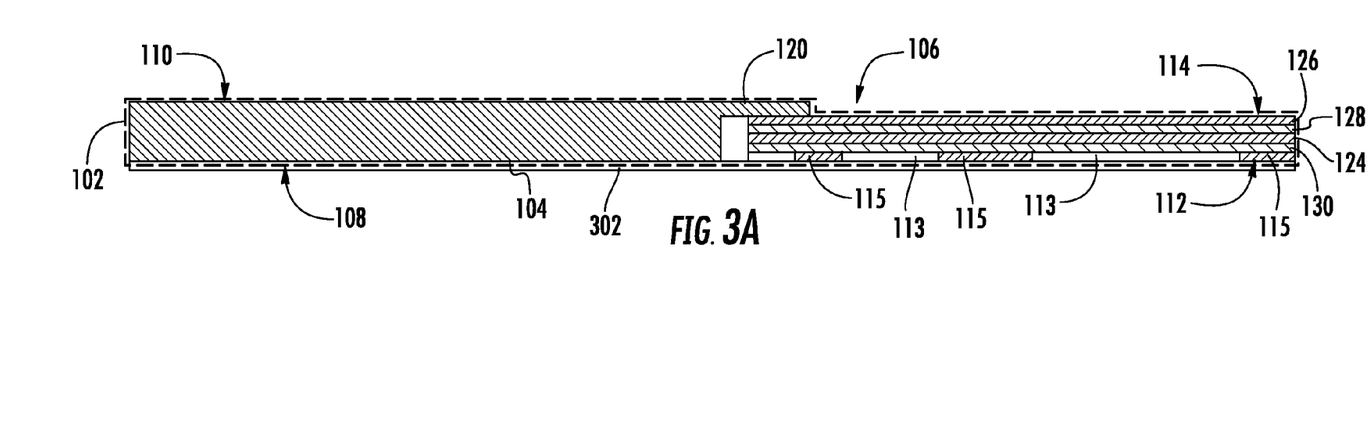
FIGS. 3A-3D are cross-sectional views of example stages in a method of manufacturing a packaged circuit having a combination lead frame and laminate substrate chip carrier.

The lead frame 104, 204 and the laminate substrate 106 can be placed on a temporary holding structure 302 such as an adhesive tape as shown in FIG. 3A. The laminate substrate 106 can be placed adjacent to the lead frame 102, 104. In embodiments where the lead frame 104, 204 is coupled to the laminate substrate 106 with side terminals 120, 220, the laminate substrate 106 and lead frame 104, 204 can be placed such that the side terminal(s) 120 align with appropriate pads on the internal surface 114 of the laminate substrate 106, and/or such that the side terminal(s) 220 align with appropriate recesses in the external surface 112.

In embodiments where the lead frame 104, 204 is coupled to the laminate substrate 106 with side terminal(s) 120, 220, once placed on the temporary holding structure 302, the side terminal(s) 120, 220 can be attached to conductive areas (e.g., pads) on the laminate substrate 106 using a suitable die attach compound. In an example, the conductive areas on the laminate substrate 106 and/or the side terminal(s) 120, 220 can be coated before placement on the temporary structure using a solder mask and solder paint or a plurality of solder balls can be placed on pads on the internal surface 114 of the laminate substrate 106. The solder between the side terminal(s) 120, 220 and the laminate substrate 106 can be reflowed once the lead frame 104, 204 and the laminate substrate 106 are in position on the temporary holding structure 302.

Figure 3B:
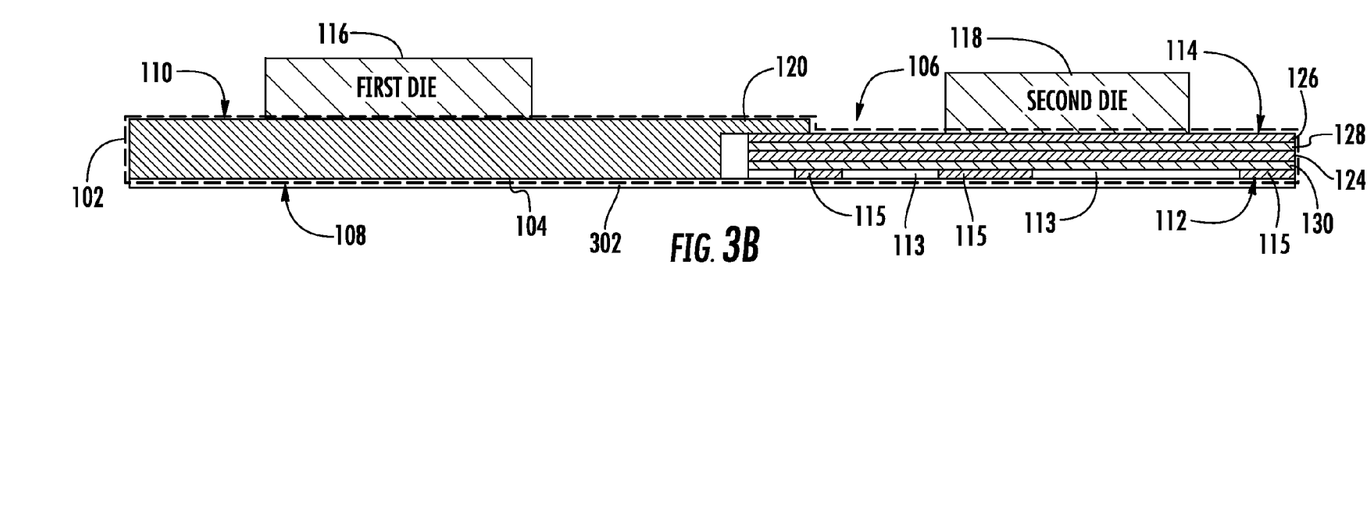

Once the lead frame 104, 204 and the laminate structure 106 are in position, the first die(s) 116 can be mounted on the lead frame 104, 204 and the second die(s) 118 can be mounted on the laminate substrate 106 as shown in FIG. 3B. In an example, the internal surface 110 of the lead frame 104, 204 and the internal surface 114 of the laminate substrate 106 can be coated with solder using a solder mask and solder paint or a plurality of solder balls can be placed on the internal surfaces 110, 114. In any case, the first die(s) 116 and the second die(s) 118 can be aligned with and placed on the lead frame 104, 204 and laminate substrate 106 respectively. In some examples, the solder can be reflowed once the dies 116, 118 are in position on the lead frame 104, 204 and the laminate substrate 106.

In some examples, wire bond(s), copper clip(s), or other similar mechanism can be attached to the first die(s) 116, second die(s) 118, lead frame 104, 204, and/or laminate substrate 106 to achieve desired coupling.

Figure 3C:
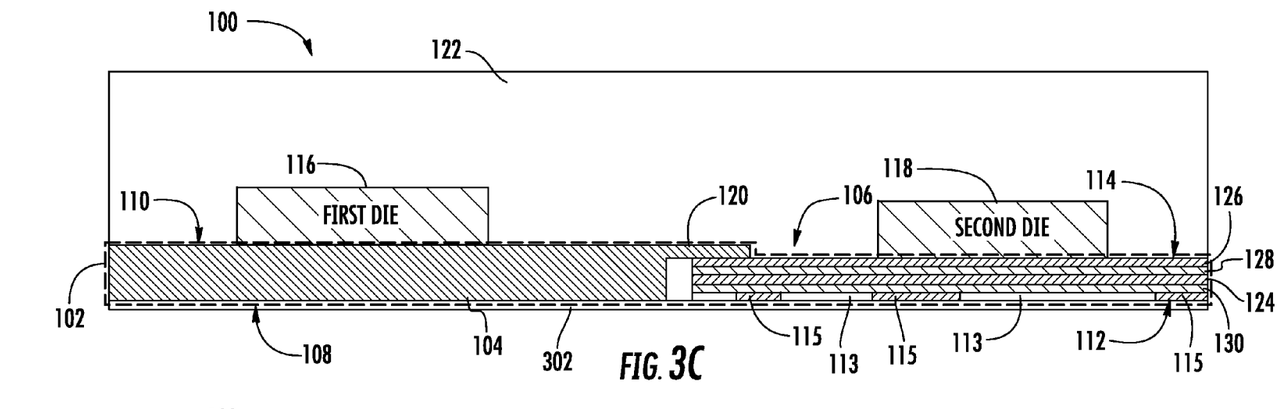
Figure 3D:
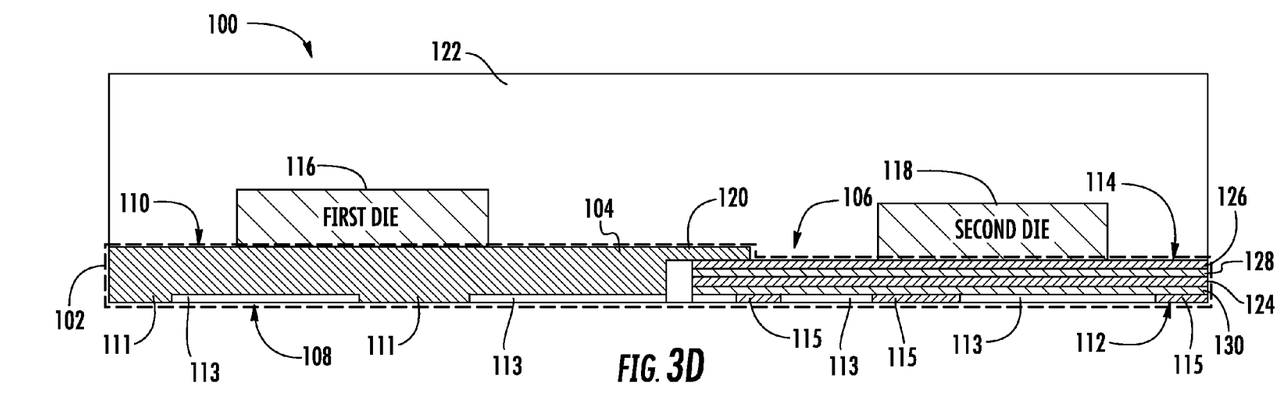

Once the dies 116, 118 have been mounted and all appropriate electrical connections have been made, molding compound 122 can be applied over the dies 116, 118 as shown in FIG. 3C. In a process forming a plurality of packaged circuits 100, 200 at the same time, molding compound 122 can be applied over the plurality of assembled circuits 100, 200. Once applied, the molding compound 122 can be cured. The packaged circuit 100, 200, can then be removed from the temporary holding structure as shown in FIG. 3D. In some examples, the external surface of the lead frame 104 can be etched after encapsulation to form one or more floating sections of the lead frame as discussed with respect to FIGS. 6A-6F below. A non-conductive material (e.g., resist) 113 is also placed on the external surface 108 of the lead frame 104 between terminals 111. When forming a plurality of packaged circuits 100, 200 at the same time, the combined multiple packaged circuits 100, 200 can be singulated before or after removal from the temporary holding structure to form a plurality of packaged circuits 100, 200.

Figure 4:
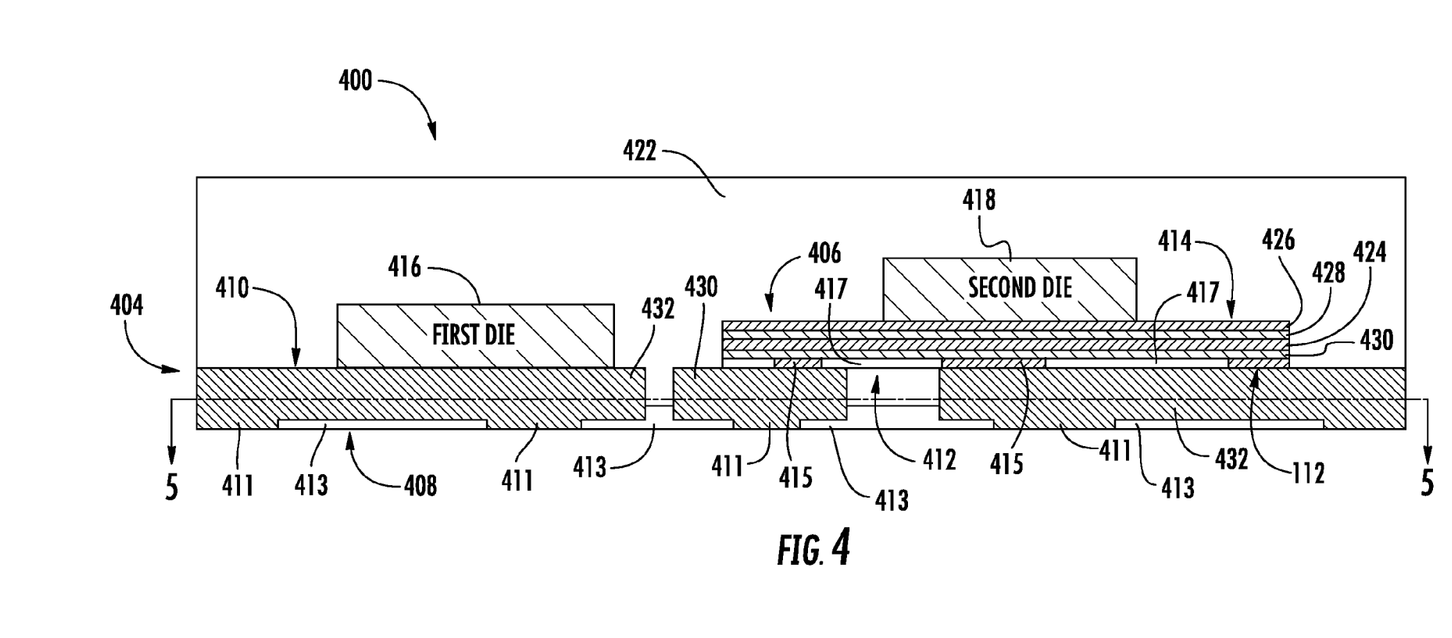
FIG. 4 is a cross-sectional view of an embodiment of a packaged circuit having a laminate substrate mounted on a lead frame that has at least one floating terminal.

FIG. 4 is a cross-sectional view of an embodiment of a packaged circuit 400 having a laminate substrate 406 mounted on a lead frame 404 that has at least one floating terminal. The lead frame 404 has an external surface 408 and an internal surface 410. The external surface 408 includes a plurality of external terminals 411 for coupling the lead frame 404 to external circuits. A non-conductive material (e.g., resist) 413 is disposed in recesses between the external terminals 411. In the example shown in FIG. 4, the external terminals 411 on the external surface 408 of the lead frame 404 are pads. In other examples, the external terminals 411 can extend from the external surface 108 of the lead frame 404 as leads. The internal surface 410 includes one more pads for mounting of one or more dies 416 and one or more laminate substrates 406. The internal surface 410 can also include one or more pads for mounting of one or more inductors, capacitors, and/or other passive components.

The lead frame 404 is composed of an electrically conductive material such as a metal. In an example, the lead frame 404 is composed of copper. The lead frame 404 is composed of a plurality of sections of conductive material. Each of the sections 430 of conductive material can include one or more external terminals 411 on the external surface 408 and one or more pad on the internal surface 410. One or more of the sections 430 of conductive material can be floating, that is the one or more floating sections 430 of conductive material do not abut against an edge of the packaged circuit 400. An external terminal 411 on a floating section 430 is also referred to herein as a "floating terminal". In addition to the one or more floating sections 430, the lead frame 404 can include one or more edge sections 432 that do abut against an edge of the packaged circuit 400.

A first one or more dies 416 (also referred to herein as simply "first die 416") are mounted and electrically coupled to the internal surface 410 of the lead frame 404. A laminate substrate 406 can also be mounted and electrically coupled to the internal surface 410 of the lead frame 404.

The laminate substrate 406 is composed of at least two layers of electrically conductive material with a layer of dielectric material between the at least two layers of electrically conductive material. The laminate substrate 406 can include traces in the conductive layers and through the dielectric material to achieve the desired routing interconnection. The example laminate substrate 406 shown in FIG. 4 includes a bottom and top layers 424, 426 of conductive material with a layer 428 of dielectric material between the bottom layer 424 and the top layer 426 and a layer 430 of dielectic material below the bottom layer 424 of conductive material. In other examples, the laminate substrate 406 can include more than two layers of conductive material with dielectric material between adjacent layers of conductive material. In an example, the conductive material is a metal (e.g., copper) and the dielectric material is a composite fiber material (e.g., pre-preg).

The laminate substrate 406 has a bottom surface 412 for mounting to the lead frame 404 and a top surface 414 for mounting of one or more dies 418 thereon. The laminate substrate 406 can include on or more pads 415 on the bottom surface 412, which are connected and electrically coupled to one or more sections 430, 432 of the lead frame. In particular, the laminate substrate 406 can be mounted and electrically coupled to a floating section 430 of the lead frame 404, such that at least one of the pads 415 is connected and electrically coupled to the floating section 430. The laminate substrate 406 can also be coupled to one or more edge sections 432 of the lead frame 404. The top surface 414 can also include appropriate pads for mounting of the one or more dies 418 to the laminate substrate 406. A non-conductive material (e.g., resist) 417 is disposed between the one or more pads 415. The terminals 415 and the resist 417 of the laminate substrate 406 can be disposed on the layer 430 of dielectric material.

A second one or more dies 418 (also referred to herein as simply "second die 418") are mounted and electrically coupled to the laminate substrate 406. Accordingly, the second die 418 can be electrically coupled to one or more external terminals 411 through the laminate substrate 406 and the lead frame 404. In particular, the second die 418 can be electrically coupled to one or more floating terminals 411 through the laminate substrate 406 and a floating section 430 of the lead frame 404.

Figure 5:
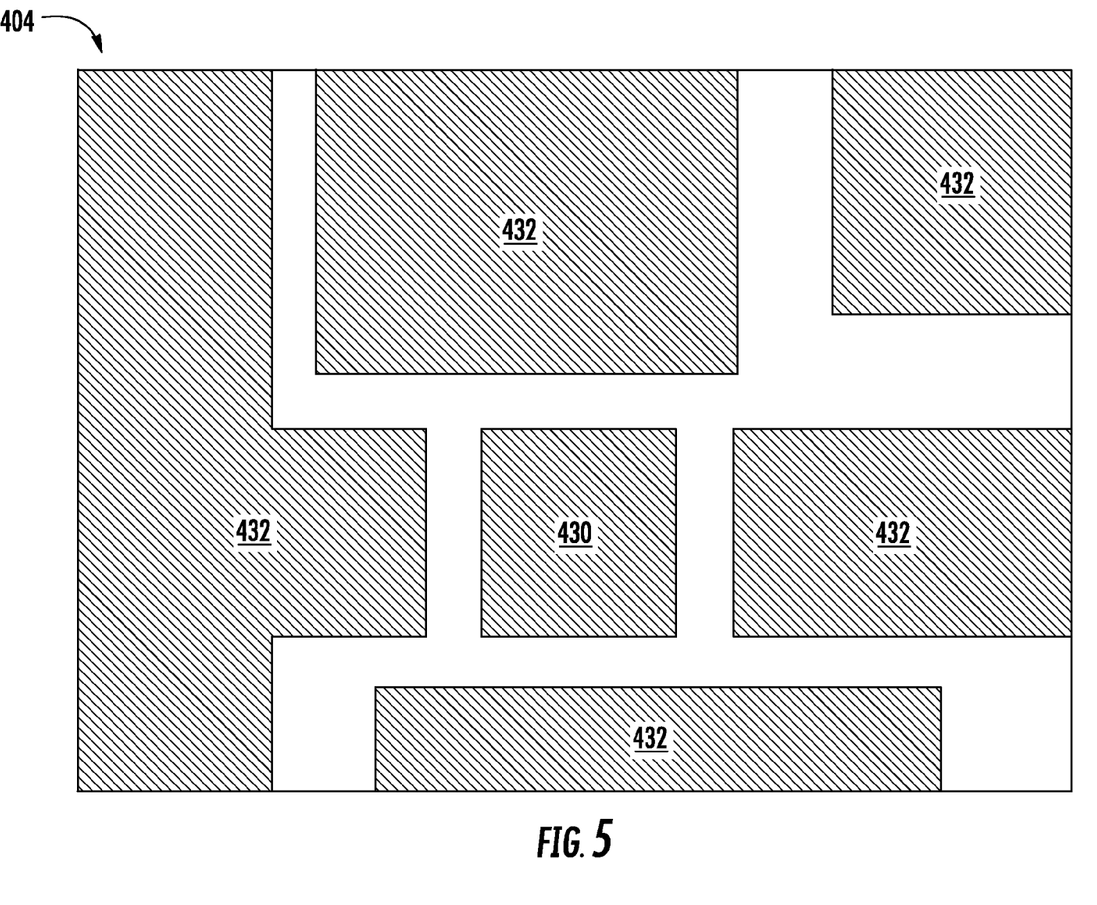
FIG. 5 is a bottom view of the packaged circuit having a laminate substrate mounted on a lead frame that has at least one floating terminal of FIG. 4.

FIG. 5 is a cross-sectional view of an example lead frame 404 for the packaged circuit 400. As shown, the lead frame 404 includes both edge sections 432 and a floating section 430; with the edge sections 432 abutting an edge of the packaged circuit 400 and the floating section 430 not abutting an edge of the packaged circuit 400. Although only a single floating section 430 is shown in this example, other examples can include more than one floating section 430. The edge sections 432 and floating section 430 can include any appropriate external terminal(s) 411 such as pad(s) or lead(s).

Referring back to FIG. 4, the first die 416 and the second die 418 can be electrically coupled together by coupling through the lead frame 404 and the laminate substrate 406. In some examples, a wire bond, copper clip, or other similar mechanism can be used to couple the second die 418 to the lead frame 404 or to the first die 416, or to couple the first die 416 to the top surface 414 of the laminate substrate 406.

The lead frame 404 can provide electrical coupling between different dies 416 on the internal surface 410. Similarly, the laminate substrate 406 can provide electrical coupling between different dies 418 on the top surface 414. Since the laminate substrate 406 is composed of multiple layers of conductive material with a dielectric material therebetween, the laminate substrate 406 can provide increased routing capability as compared to the lead frame 404. Accordingly, dies have more extensive routing requirements within the system 400 can be mounted to the laminate substrate 406. The lead frame 404, however, can provide increased heat dissipation capabilities as compared to the laminate substrate 406. Accordingly, dies having more extensive heat dissipation requirements can be mounted to the lead frame 404. This combination of a lead frame 404 and a laminate substrate 406 can provide good heat dissipation and good routing capabilities with high density.

In an example, the packaged circuit 400 comprises a power conversion system. The power conversion system can include a power stage as well as a controller and/or drive for the power stage. In an example, dies including power stage components (e.g., transistors) that generate substantial amounts of heat can be mounted to the lead frame 404 and dies including controller and/or driver components can be mounted to the laminate substrate 406. For example, the first die 416 can include one or more of a high side FET, low side FET, or a diode e.g., a Schottky diode). Other components such as a power inductor can also be included on the lead frame 404 and/or laminate substrate 406. Accordingly, the power stage components can achieve good heat dissipation and the controller and/or driver components can achieve good routing of connections in the same packaged circuit. In an example, the power conversion system can comprise a DC-to-DC power converter, a charger, a hot-swap controller, an AC-DC converter, a bridge driver, a buck converter, a boost converter, a buck-boost converter, a synchronous buck converter, or a portion of any of these circuits.

Molding compound 422 can surround the first die 416, second die 418, and laminate substrate 416 over the lead frame 404. The molding compound 422 can comprise any suitable molding compound such as a ceramic, plastic, or epoxy.

Manufacturing the circuit 400 into a package can include manufacturing a plurality of packaged circuits 400 at the same time. Accordingly, a plurality of lead frames 404 can be provided adjacent to one another, each having first die(s) 416, laminate substrate(s) 406, and second die(s) 418 mounted thereon. Once assembled, the lead frames 404 can be singulated to form the individual packaged systems. The following description refers to the process of forming a single packaged circuit 400, but it should be understood that the process can involve forming a plurality of packaged circuits 400 at the same time.

FIGS. 6A-6F are cross-sectional views of example stages in a method of manufacturing a packaged circuit 400 having a laminate substrate 406 mounted on a lead frame 404 that has at least one floating terminal. The lead frame 404, laminate substrate(s) 406, first die(s) 416, and second die(s) 418 are all obtained. The first die(s) 416 and second die(s) 418 can each be fabricated as a die (e.g., a monolithic substrate) using appropriate semiconductor processes. The laminate substrate 406 can be manufactured having appropriate pads (415) on the internal and external surfaces 412, 414 and appropriate routing through the layers 424, 426, 428, 430.

Figure 6A:
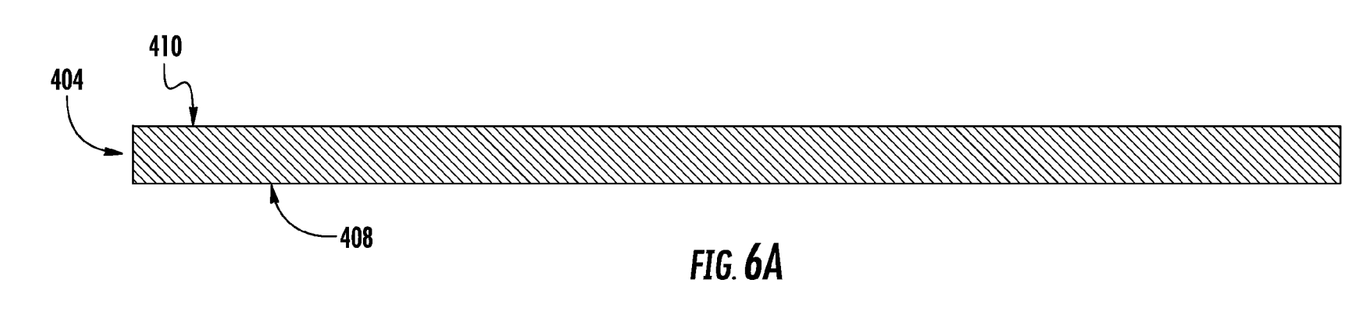
FIGS. 6A-6F are cross-sectional views of example stages in a method of manufacturing a packaged circuit having a laminate substrate mounted on a lead frame that has at least one floating terminal.
Figure 6B:
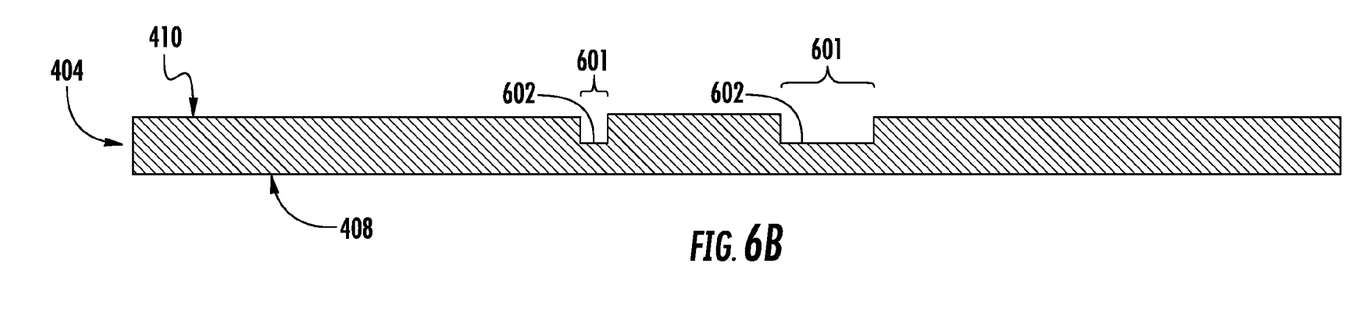

FIG. 6A illustrates a blank lead frame 404. The lead frame 404 can be partially etched, as a first partial etch, from the internal (top) surface 410 along dividing lines 601, which correspond to the spaces between sections 430, 432 of the final lead frame 404. The first partial etch is referred to as a "partial" etch since the first partial etch extends only a portion of the way through the lead frame 402 from the internal surface 105 to the external (bottom) surface 408. The first partial etch results in a lead frame 404 having a plurality of trenches 602 defined in the internal surface 410 as shown in FIG. 6B. To perform the first partial etch, resist is placed on the internal surface 410 of the lead frame 404, but resist is not placed on the dividing lines 601 where the lead frame 404 is to be removed with the etch. In an example, the first partial etch extends between 50 and 75% of the way through the lead frame 404 and, in a particular example, extends around 62% of the way through the lead frame 404 which can be about 0.125 mm into the top surface 410. In other examples, the first partial etch can extend in other distances. After the first partial etch, plating can be deposited on the internal surface 410 of the lead frame 404.

Figure 6C:
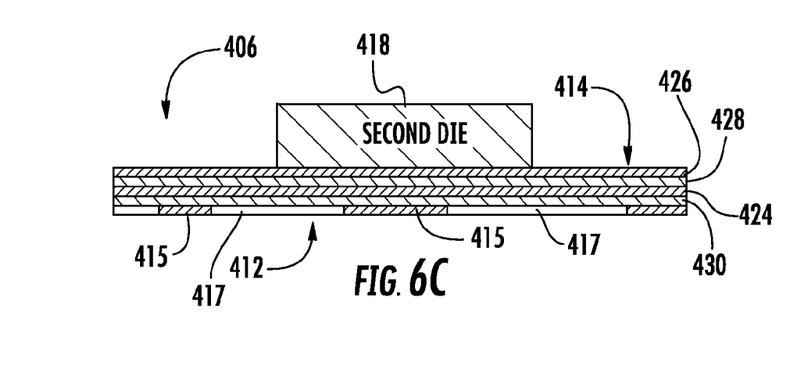

Separate from the lead frame 404, the second die(s) 418 can be mounted on the laminate substrate(s) 406 as shown in FIG. 6C. In an example, the top surface 414 of the laminate substrate(s) 406 can be coated with solder using a solder mask and solder paint or a plurality of solder balls can be placed on the top surface 414. In any case, the second die(s) 418 can be aligned with and placed on the top surface 414 of the laminate substrate(s) 406. In some examples, the solder can be reflowed once the second die(s) 418 are in position on the laminate substrate(s) 406.

Figure 6D:
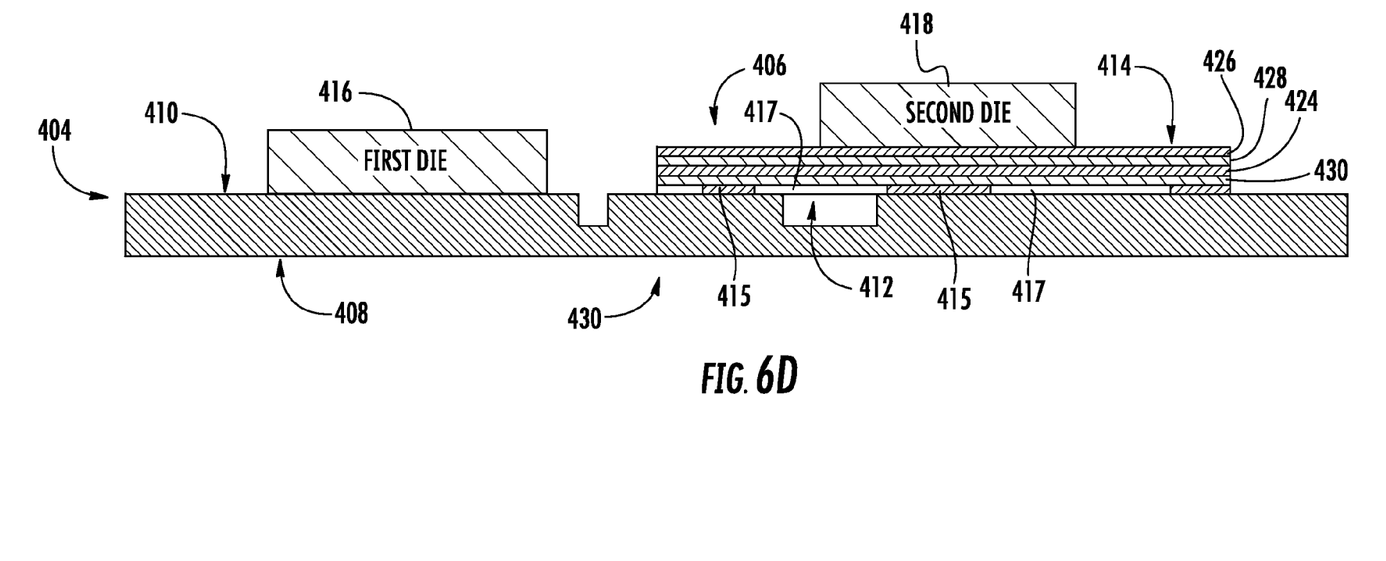

After the first partial etch and before the second partial etch described below, the laminate substrate(s) 406, with the second die(s) 418 thereon, and the first die(s) 416 can be mounted on the internal surface 410 of the lead frame 404 as shown in FIG. 6D.

The laminate substrate 406 can be mounted, at least partially, on an area of the lead frame 404 that comprises a floating section 430. In particular, the one or more pads 415 on the bottom surface 412 of the laminate substrate 406 can be attached and electrically coupled to one or more floating sections 430 of the lead frame 404. In some examples, one or more pads 415 of the laminate substrate 406 can also be attached and electrically coupled to one or more edge sections 432 of the lead frame 404. In an example, the internal surface 410 of the lead frame 404 can be coated with solder using a solder mask and solder paint or a plurality of solder balls can be placed on the internal surface 410. In any case, the laminate substrate(s) 406 and the first die(s) 416 can be aligned with and placed on the lead frame 404. In some examples, the solder can be reflowed once the laminate substrate(s) 406 and the first die(s) 416 are in position.

In some examples, wire bond(s), copper clip(s), or other similar mechanism can be attached to the first die(s) 416, second die(s) 418, lead frame 404, and laminate substrate(s) 406 to achieve desired coupling.

Figure 6E:
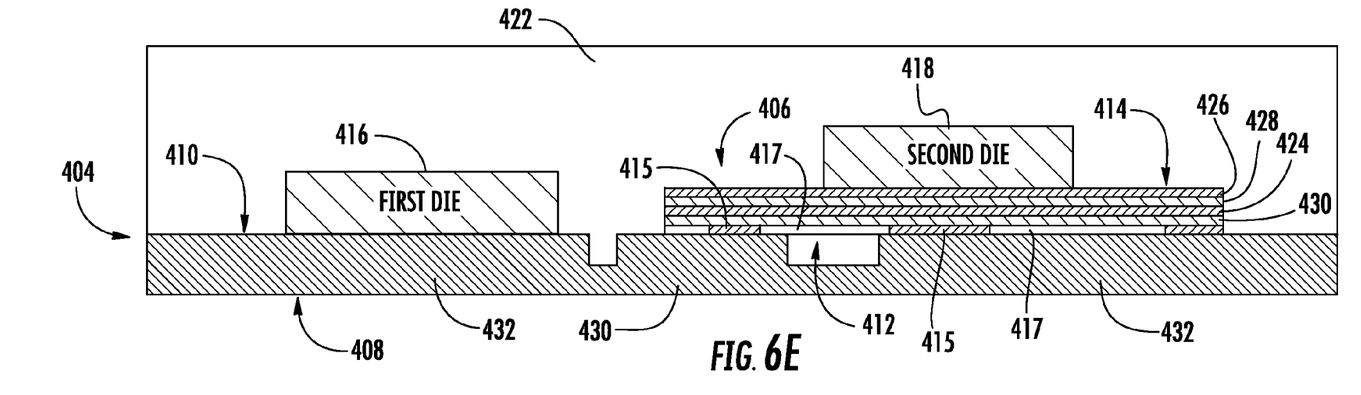

Once the laminate substrate(s) 406 and all the dies 416, 418 have been mounted on the lead frame 404 and all appropriate electrical connections have been made, molding compound 422 can be applied over the dies 416, 418, and the laminate substrate(s) 406 as shown in FIG. 6E. In a process forming a plurality of packaged circuits 400 at the same time, the molding compound 422 can be applied over the plurality of assembled circuits 400. Once applied, the molding compound 422 can be cured.

Figure 6F:
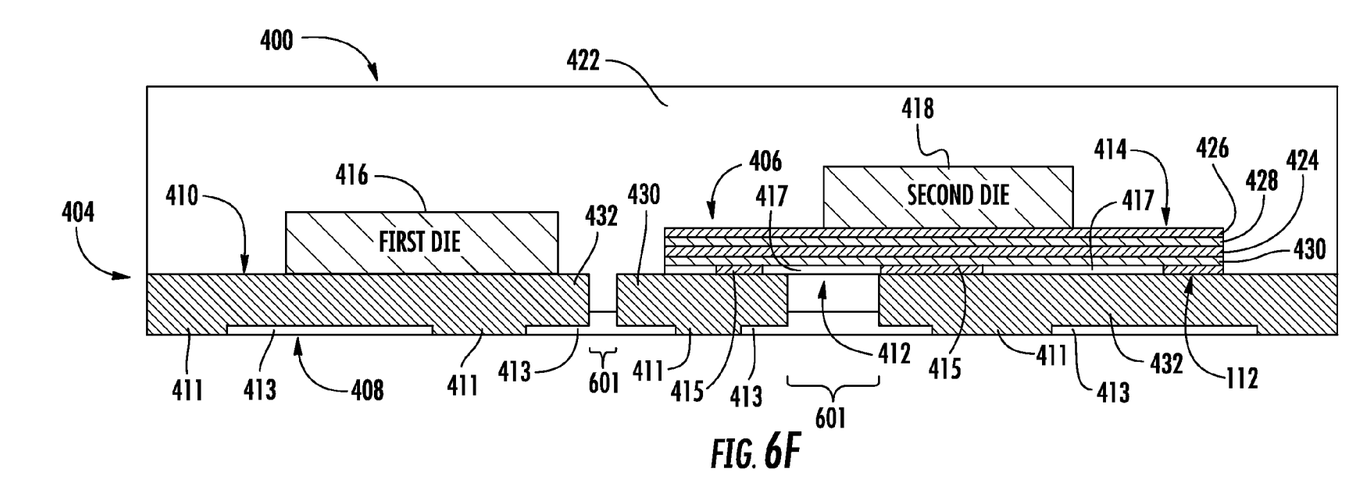

Once the molding compound 422 is cured, the external surface 408 of the lead frame 404 can be etched to remove portions of the external surface 408 of the lead frame 404 as a second partial etch as shown in FIG. 6F. The second partial etch can overlap the dividing lines 601 between future sections of the lead frame 404. Similar to the first partial etch, the second partial etch extends a portion of the way through the lead frame 404 from the external surface 408 toward the internal surface 410. The second partial etch can be aligned with the first partial etch and extend through the lead frame 404 enough to meet the first partial etch such that adjacent sections 430, 432 of the lead frame 404 are disconnected and electrically de-coupled from one another. That is, the second partial etch occurs at a location of the lead frame 404 reverse of the first partial etch such that the combination of the first partial etch and the second partial etch etches entirely through the lead frame 404 and disconnects different sections of the lead frame 404 from one another. To perform the second partial etch, a resist is placed on the external surface 408 of the lead frame 404 that are not to be etched, are resist is not placed on the dividing lines 601, which are etched.

After the second partial etch is complete, electrically non-conductive and conductive coatings can then be coated on appropriate portions of the external surface 408 of the lead frame 404 to form external terminals 411 and non-conductive portions 413 in appropriate locations. The electrically non-conductive coating 413 can comprise a solder mask material (e.g., resist) including both organic and non-organic materials. In some examples, input/output land plating or the like can be applied to the external surface 408 of the lead frame 404.

When forming a plurality of packaged circuits 400 at the same time, the combined multiple packaged circuits 400 can be singulated to form a plurality of packaged circuits 400.

Figure 7:
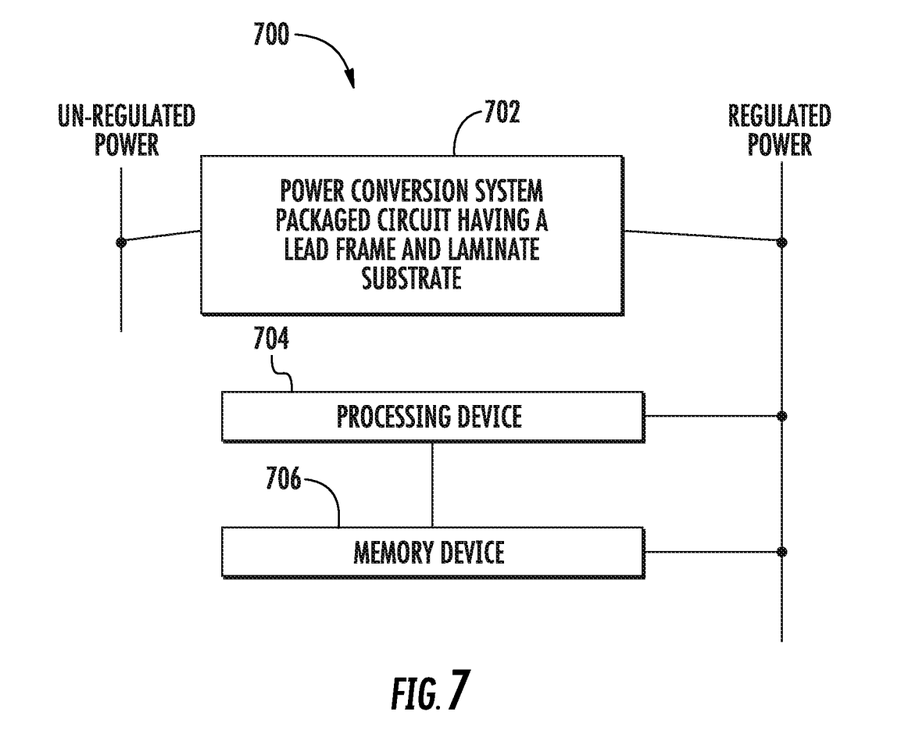
FIG. 7 is a block diagram of an embodiment of a system including a packaged power conversion system having a combination lead frame and laminate chip carrier providing regulated power to a processing device and a memory device.

FIG. 7 is a block diagram of an example system 700 including a power conversion system or a portion of a power conversion system in a packaged circuit 100, 200, and/or 400 as described above. System 700 includes one or more power conversion systems 702 coupled to one or more processing devices 704 and one or more memory devices 706. The one or more power conversion systems 702 can receive unregulated power (e.g., line power), regulate the power, and provide regulated power to the one or more processing devices 704 and one or more memory devices 706. In an example, the one or more processing devices 704 can include a central processing unit (CPU), microcontroller, microprocessor (e.g., a digital signal processor (DSP)), field programmable gate array (FPGA), application specific integrated circuit (ASIC), or other processing device. The one or more memory devices 706 can include a conventional hard disk, volatile or non-volatile media such as a solid state hard drive, random access memory (RAM) including, but not limited to, synchronous dynamic random access memory (SDRAM), double data rate (DDR) RAM, RAMBUS dynamic RAM (RDRAM), static RAM (SRAM), etc.), electrically erasable programmable ROM (EEPROM), and flash memory, etc. The one or more processing devices 704 can be communicatively coupled to the one or more memory devices 706.

In other examples, such a power conversion system can provide regulated power to other functional circuits instead of or in addition to one or more processing devices and one or more memory devices. For example, such a power conversion system can provide power to internal device components, peripheral devices, or other components. Such a power conversion system can be included in any suitable electronic device using regulated power such as a desktop, laptop, or tablet computer, a set top box, battery charger, or other device.

The directional references top and bottom stated and illustrated in this application should not be taken as limiting. The directions top and bottom are merely illustrative and do not correspond to absolute orientations. That is, a "top" or "bottom" surface refers merely to a relative orientation with respect to the lead frame and is not an absolute direction. For example, in actual electronic applications, a packaged chip may well be turned on its "side", causing the "bottom" described herein to face sidewise.

A number of examples of the invention defined by the following claims have been described. Nevertheless, it will be understood that various modifications to the described examples may be made without departing from the spirit and scope of the claimed invention. Features and aspects of particular examples described herein can be combined with or replace features and aspects of other examples. Accordingly, other examples are within the scope of the following claims.

EXAMPLE EMBODIMENTS

Example 1 includes a circuit comprising: a lead frame having a first plurality of exposed terminals, the lead frame defining a plane; a laminate substrate in the plane defined by the lead frame, adjacent to the lead frame, and electrically coupled to the lead frame, the laminate substrate having a first surface including a second plurality of exposed terminals and a second surface opposite the first surface; a first one or more dies mounted on the lead frame and electrically coupled to the lead frame; and a second one or more dies mounted on the second surface of the laminate substrate and electrically coupled to the laminate substrate.

Example 2 includes the circuit of Example 1, wherein the lead frame includes one or more side terminals extending from a first side thereof, wherein the laminate substrate is adjacent to the first side, the one or more side terminals coupled to a conductive portion of the laminate substrate.

Example 3 includes the circuit of Example 2, wherein the one or more side terminals are portions of conductive material that are thinner than a main portion of the lead frame.

Example 4 includes the circuit of Example 3, wherein the one or more side terminals extend onto a portion of the second surface of the laminate substrate and electrically couple to conductive pads on the second surface.

Example 5 includes the circuit of any of Examples 3 or 4, wherein the one or more side terminals extend onto a portion of the first surface of the laminate substrate and electrically couple to conductive pads on the first surface.

Example 6 includes the circuit of any of Examples 1-5, wherein the laminate substrate is composed of at least two layers of conductive material having at least one dielectric layer between the at least two layers, wherein a first layer of conductive material forms the first surface of the laminate substrate and a second layer of conductive material forms the second surface of the laminate substrate.

Example 7 includes the circuit of any of Examples 1-6, wherein the first plurality of exposed terminals comprise leads that extend outward from a bottom side of the lead frame; and wherein the second plurality of exposed terminals comprise leads the extend outward from the first surface of the laminate substrate.

Example 8 includes the circuit of any of Examples 1-7, wherein the first plurality of exposed terminals comprise pads on the first surface of the lead frame; and wherein the second plurality of exposed terminals comprise pads on the first surface of the laminate substrate.

Example 9 includes the circuit of any of Examples 1-8, comprising: a plurality of coupling members connected to an internal surface of the lead frame and to the second surface of the laminate substrate, wherein the plurality of coupling members include at least one of a wire bond or a copper clip.

Example 10 includes the circuit of any of Examples 1-9, comprising: molding compound on the lead frame and the laminate substrate and surrounding the first and second one or more dies.

Example 11 includes the circuit of any of Examples 1-10, wherein the first one or more dies include one or more power transistors and the second one or more dies include one or more controllers.

Example 12 includes a circuit comprising: a lead frame having a plurality of sections of conductive material, including at least one floating section that does not abut against an edge of the lead frame, the lead frame having a first surface including one or more pads and a second surface including a plurality of external terminals, wherein at least one of the external terminals is disposed on the at least one floating section; a first one or more dies mounted to the first surface of the lead frame; a laminate substrate mounted to the first surface, the laminate substrate having a third surface and a fourth surface, the third surface attached to the first surface of the lead frame, wherein the laminate substrate is coupled to the floating section; and a second one or more dies mounted to the fourth surface of the laminate substrate.

Example 13 includes a method of manufacturing a circuit comprising: placing a lead frame and a laminate substrate on a temporary holding structure such that the lead frame and the laminate substrate are adjacent to one another in the same plane; attaching one or more first dies to the lead frame and one or more second dies to the laminate substrate; attaching one or more interconnect mechanisms to one or more of the lead frame, laminate substrate, the one or more first dies, and the one or more second dies; encapsulating the one or more first dies, the one or more second dies, the lead frame, and the laminate substrate; and removing the temporary holding structure.

Example 14 includes the method of Example 13, wherein placing a lead frame and a laminate substrate includes aligning one or more side terminals of the lead frame with corresponding pads on a surface of the laminate substrate; and attaching the one or more side terminals of the lead frame to the laminate substrate using a die attach compound.

Example 15 includes the method of any of Examples 13 or 14, wherein attaching one or more interconnect mechanisms includes attaching an interconnect mechanism to an internal surface of the lead frame and to an internal surface of the laminate substrate to couple the lead frame to the laminate substrate.

Example 16 includes the method of any of Examples 13-15, wherein the temporary holding structure comprises adhesive tape.

Example 17 includes an electronic device comprising: one or more processing devices; one or more memory devices communicatively coupled to the one or more processing devices; and one or more power conversion systems coupled to the one or more processing devices and the one or more memory devices, the one or more power conversion systems including: a lead frame having a first plurality of exposed terminals; a laminate substrate adjacent to the lead frame and electrically coupled to the lead frame, the laminate substrate having an external surface including a second plurality of exposed terminals and an internal surface; a first one or more power transistors mounted on the lead frame and electrically coupled to the lead frame; and a controller die mounted on the internal surface of the laminate substrate and electrically coupled to the laminate substrate.

Example 18 includes the electronic device of Example 17, wherein the electronic device comprises one of desktop, laptop, or tablet computer, a set top box, or a battery charger.

Example 19 includes the electronic device of any of Examples 17 or 18, wherein the lead frame includes one or more side terminals extending from a first side thereof, wherein the laminate substrate is adjacent to the first side, and the one or more side terminals overlap and are coupled to the internal surface of the laminate substrate.

Example 20 includes the electronic device of Example 19, wherein the one or more side terminals are portions of conductive material that are integral with the lead frame.

Example 21 includes the electronic device of any of Examples 17-20, comprising: one or more interconnect mechanisms coupled to the lead frame and the internal surface of the laminate substrate.

What is claimed is:

1. A method of manufacturing a circuit comprising:
   placing a lead frame and a laminate substrate on a temporary holding structure such that the lead frame and the laminate substrate are adjacent to one another in the same plane;
   attaching one or more first dies to the lead frame and one or more second dies to the laminate substrate;
   attaching one or more interconnect mechanisms to one or more of the lead frame, laminate substrate, the one or more first dies, and the one or more second dies;
   encapsulating the one or more first dies, the one or more second dies, the lead frame, and the laminate substrate; and
   removing the temporary holding structure.

2. The method of claim 1, wherein placing the lead frame and the laminate substrate includes aligning one or more side terminals of the lead frame with corresponding pads on a surface of the laminate substrate; and
   attaching the one or more side terminals of the lead frame to the laminate substrate using a die attach compound.

3. The method of claim 1, wherein attaching one or more interconnect mechanisms includes attaching an interconnect mechanism to an internal surface of the lead frame and to an internal surface of the laminate substrate to couple the lead frame to the laminate substrate.

4. The method of claim 1, wherein the temporary holding structure comprises adhesive tape.

\* \* \* \* \*